(12) United States Patent
Weber

(10) Patent No.: US 6,271,976 B1
(45) Date of Patent: Aug. 7, 2001

(54) APPARATUS FOR TILTING AN OBJECT ABOUT AT LEAST ONE AXIS, IN PARTICULAR AN OPTICAL ELEMENT

(75) Inventor: Ulrich Weber, Koenigsbronn (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/490,890

(22) Filed: Jan. 27, 2000

(30) Foreign Application Priority Data

Feb. 12, 1999 (DE) .............................. 199 05 779

(51) Int. Cl.$^7$ ............................................. G02B 7/02
(52) U.S. Cl. ............................................. 359/819
(58) Field of Search .................... 359/810, 811, 359/812, 813, 819, 822, 830

(56) References Cited

U.S. PATENT DOCUMENTS

| | | |
|---|---|---|
| 3,917,385 | 11/1975 | Caswell . |
| 3,989,358 | 11/1976 | Melmoth . |
| 4,298,248 | 11/1981 | Lapp . |
| 5,353,167 | * 10/1994 | Kuklo et al. .................... 359/876 |
| 5,986,827 | * 11/1999 | Hale .................................. 359/822 |
| 6,191,898 | * 2/2001 | Trunz et al. ...................... 359/819 |

FOREIGN PATENT DOCUMENTS

| | | | |
|---|---|---|---|
| 278 207 A1 | 4/1990 | (DE) . | |
| 235134-A | * 8/2000 | (JP) | ................... G02B/7/02 |

* cited by examiner

*Primary Examiner*—Georgia Epps
*Assistant Examiner*—Saeed Seyrafi
(74) *Attorney, Agent, or Firm*—Welsh & Katz, Ltd.

(57) ABSTRACT

In the case of an apparatus for tilting an object about at least one axis, in particular an optical element, such as a lens (9), the object in the case of an optical element is supported by an inner ring (7) and connected via at least three bearing points to a mount or an outer ring (8). Tilting of the object (9) is adjustable by means of adjusting elements. A plurality of links (1–6) are provided as adjusting elements, some of which, as supporting links (1–4), bear the inner ring (7) with respect to the outer ring (8) in such a way that the inner ring (7) can rotate only about two mutually perpendicular tilting axes (x, y axis). Two further links, as adjusting links (5, 6), support torsional moments about the mutually perpendicular tilting axes. The tilting angles are adjustable by adjusting the adjusting links (5, 6).

12 Claims, 4 Drawing Sheets

APPARATUS FOR TILTING AN OBJECT ABOUT AT LEAST ONE AXIS, IN PARTICULAR AN OPTICAL ELEMENT

FIELD OF THE INVENTION

The invention concerns an apparatus for tilting an object about at least one axis, in particular an optical element, according to the preamble of claim 1.

DESCRIPTION OF THE INVENTION

An apparatus of this type is described in DD 278 207 A1. Provided in the latter is a mount with adjusting elements, on which individually mounted optical elements are arranged in a nested-cell mounting tube. The adjusting elements comprise two annular disks which are directly adjacent to one another and can be rotated one in the other and independently of one another. Rotations of the annular disks, which form a pair of tapered rings, allow a defined inclination of the optical axis of the optical element to be set. In this way, the optical axes of individual optical elements can be aligned with great accuracy with respect to the mechanical axis of a lens system. An apparatus of this type allows alignment of the optical axis of an individual optical element that does not coincide with the optical axis of the lens system in which the optical element is fitted.

The skewed position of an optical axis of an optical element may be caused, for example, by production inaccuracies or flange unevennesses of an outer ring. The adjusting elements according to DD 278 207 A1 allow deviations of the optical axes of optical elements from the axis of the lens system to be corrected, but not with the great accuracy required for lens systems for semiconductor lithography, since the adjustment with the pair of tapered rings is affected by friction and consequently so-called stick-slip and hysteresis effects occur, resulting in "over"correction. Therefore, a slightly greater adjustment than desired is always set. Moreover, in the case of the known apparatus the optical element is not, however, isolated in terms of deformation from the outer mount, so that stresses and deformations on the flange are transferred to the optical element.

SUMMARY OF THE INVENTION

The present invention is based on the object of improving an apparatus of the type mentioned at the beginning in such a way that an object, in particular an optical element, can be swiveled very accurately at least about one axis, but in particular about two axes, it also being intended for the object to be at the same time isolated in terms of deformation from its mount or its outer ring.

This object is achieved according to the invention by the features stated in the defining part of claim 1.

According to the invention, the inner ring, which bears the optical element, is now connected to the mount or the outer ring via a total of six links. Four links serve in this case as so-called supporting links in such a way that the inner ring can rotate only about the two mutually perpendicular tilting axes. The two other links, which act as adjusting links, respectively support the torsional moments about the two tilting axes (x axis and y axis) and serve at the same time for setting and adjusting the tilting angles. The links consequently have the effect that the mounting of the inner ring is statically determined, isolation of the inner ring from the outer ring in terms of deformation being simultaneously achieved in this way. Since the two tilting axes are mutually perpendicular, the tilting movements do not influence one another, for which reason subsequent corrects are not necessary when an adjustment is made in one direction.

If, in a very advantageous design of the invention, it is provided that the two tilting axes extend through the z axis, i.e. through the optical axis when the object is an optical element, a vertical offset of the optical element during tilting is avoided.

The supporting links may be designed in any way desired. For example, solid joints, ball joints or the like may be used for this purpose, it being possible for the connection to the inner ring and the outer ring to take place in each case via a joint or an adjustable or compliant connection.

In the case of tilting manipulators, which are known from practice and are based on a three-point or hexapod mounting of the inner ring in the outer ring, during tilting the optical element undergoes a vertical offset because of the tilting axes being askew with respect to the optical axis and this has to be rectified by subsequent tilting about other tilting axes. Since, the two tilting axes can intersect the optical axis of the optical element in the apparatus according to the invention, in this case no axial offset takes place during tilting.

In the case of known tilting manipulators, apart from cardanic suspensions, the tilting movements still influence one another, since the tilting axes are not mutually perpendicular. In the case of the apparatus according to the invention, on the other hand, the tilting axes are mutually perpendicular, so that the tilting movements do not influence one another.

According to the invention, the adjusting range is chosen such that it is possible to correct the tilting angle between the inner ring and outer ring produced by the statically determined mounting when there is deformation of the outer ring, for example due to the outer ring being screwed onto an uneven underlying surface. Also conceivable is deliberate tipping of the inner ring, tipping generally being restricted to relatively small angular ranges for reasons of practicability, for example solid joints.

BRIEF DESCRIPTION OF THE DRAWINGS

Further advantageous designs and developments emerge from the other subclaims and from the following exemplary embodiment, represented in principle below on the basis of the drawing, in which:

DETAILED DESCRIPTION OF THE INVENTION

Figure 5:
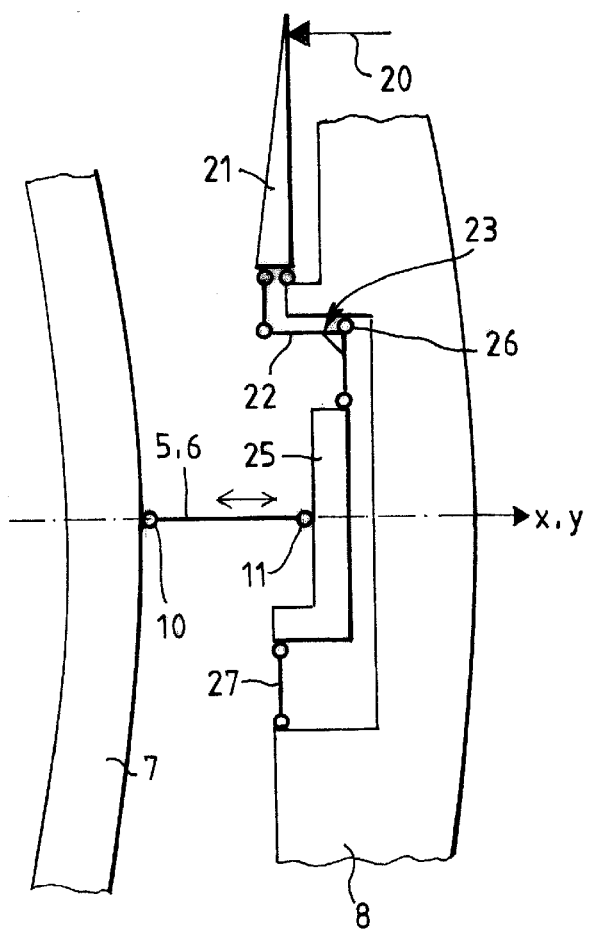
FIG. 5 shows a detail of a basic representation of an adjusting link with an adjusting device.

Four supporting links 1, 2, 3 and 4 and two adjusting links 5 and 6 connect an inner ring 7 to an outer ring 8. The inner ring 7 bears an optical element 9 (not represented in FIG. 1 for reasons of overall clarity). Each of the six links has a joint 10, by which the associated link is connected to the inner ring 7, and a further link 11, by which the associated link is likewise connected to the outer ring 8, or an adjusting mechanism (see FIG. 5, designations 21–27), which is held by the outer ring 8. The joints 10 and 11 may be designed as ball joints, solid joints or in a similar way.

The connection of the inner ring 7 to the outer ring 8 via the six links has the effect that the inner ring 7 is isolated from production inaccuracies of the outer ring 8 or the mount and from deformations of the latter. At the same time, however, an adjustment can be performed by means of the six links about two mutually perpendicular axes, namely the x axis and the y axis. This takes place in the following way:

The inner ring 7 is supported on the outer ring 8 by the four supporting links 1, 2, 3 and 4 in such a way that only two degrees of freedom, namely about the x axis and the y axis, remain for the inner ring 7. These two axes represent the tilting axes. The y axis as the axis of rotation or tilting axis is in this case given by the points of intersection 12 and 13, the joining line of which represents the y axis. The point of intersection 12 for this is given by the continuation line 14 of the supporting links 1 with the continuation line 15 of the supporting link 2, and the point of intersection 13 is given by the continuation line 16 of the supporting link 3 with the continuation line 17 of the supporting link 4.

In a similar way, the axis of rotation or tilting axis which lies at 90° thereto, namely the x axis, is formed by means of a joining line through the points of intersection 18 and 19. The point of intersection 18 is given in this case by the continuation line 15 of the supporting link 2 with the continuation line 16 of the supporting link 3. The point of intersection 19 is given by the continuation line 14 of the supporting link 1 with the continuation line 17 of the supporting link 4. Expressed another way, in the exemplary embodiment the supporting links 1 and 2 form one plane and the supporting links 3 and 4 form the other plane, the line of intersection of the two planes representing the tilting axis.

Figure 1:
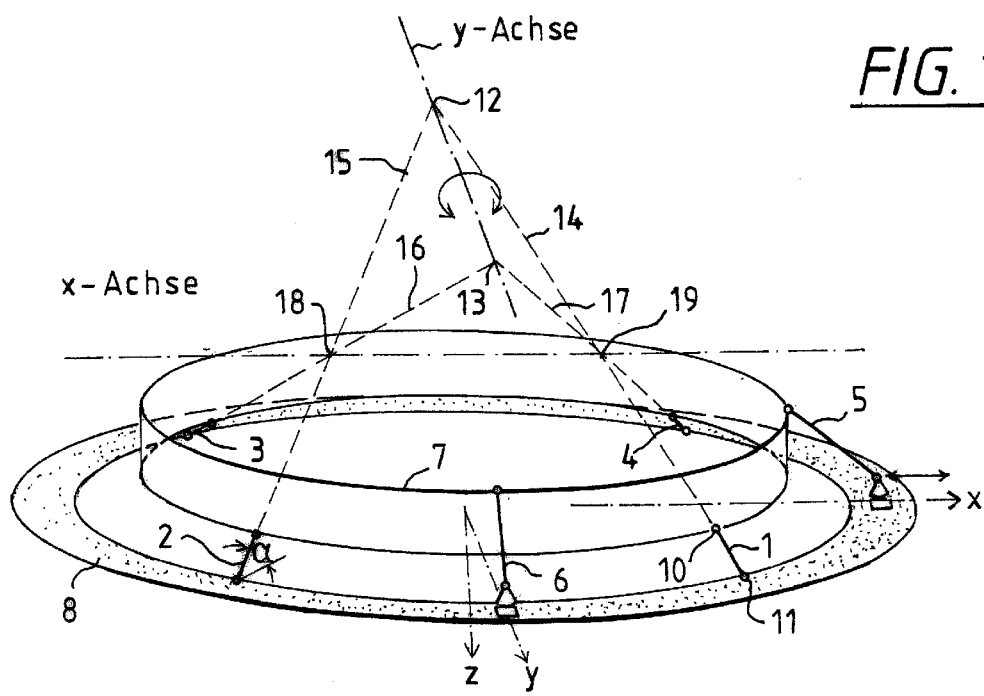
FIG. 1 schematically shows a perspective representation of the apparatus according to the invention with an inner ring, supporting and adjusting links and an outer ring.

With this design and arrangement of the supporting links 1 to 4, the axis of rotation or tilting axes x, y axis pass precisely through the z axis. At the same time, a setting angle α lies as the supporting link setting angle of the angles between the supporting links 1, 2, 3 and 4 and the xy plane. As can be seen, the two tilting axes according to the exemplary embodiment shown in FIG. 1 are, however, offset vertically in relation to one another, for which reason a lateral offset occurs during tilting. The closer the two tilting axes lie to the inner ring 7, i.e. the shallower a setting angle α of the supporting links with respect to the xy plane, the smaller the lateral offset. It is disadvantageous, however, that in this case the rigidity of the apparatus in the z direction suffers. Conversely, the steeper or greater the angles α of the supporting links with respect to the z axis, the further the tilting axes lie away from the outer ring 8 and the more rigid the apparatus is in the z direction, the lateral offset correspondingly increasing however. This means that in practice the setting angles α of the supporting links are chosen according to the desired requirements.

The adjusting link 5, which lies on the x axis of the inner ring 7 or outer ring 8, supports torsional moments about the y axis. The tilting angle of the inner ring 7 about the y axis of rotation can be set by a displacement of the adjusting link 5 in the x direction with respect to the outer ring 8.

The adjusting link 6 supports the torsional moments about the x axis and, for this purpose, is located on the y axis of the outer ring 8. By a displacement of the adjusting link 6 in the y direction with respect to the outer ring 8, the tilting angle of the inner ring 7 about the x axis can be set.

Figure 2:
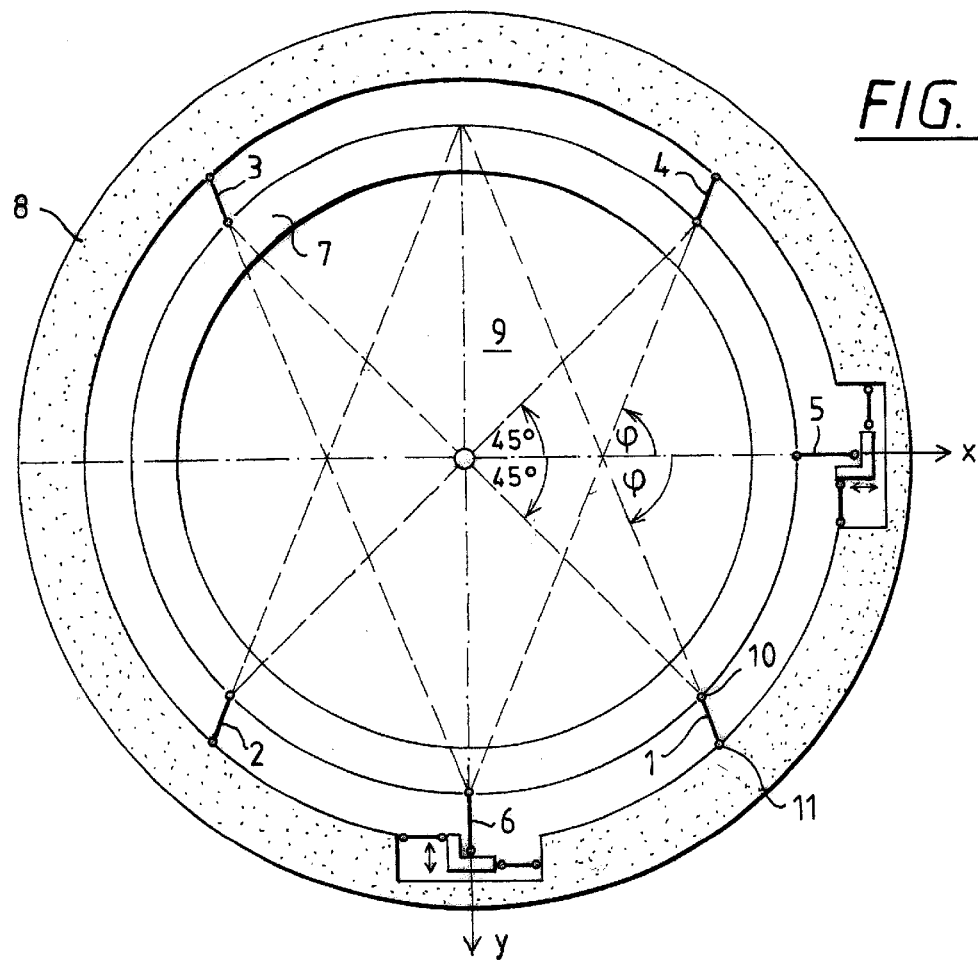
FIG. 2 shows a plan view of the apparatus according to FIG. 1 in a basic representation.

An arrangement angle $\phi$ describes the arrangement of the supporting links 1 to 4 with respect to the inner ring 7 in plan view (see FIG. 2). The arrangement angle $\phi$ is the angle between the tangent of the contact point of the supporting links 1, 2, 3 and 4 respectively on the inner ring 7 and of the supporting links projected into the xy plane. The arrangement angle $\phi$ of the supporting links 1, 2, 3 and 4 consequently establishes the axial position of the tilting axes in relation to one another. Since the setting angle α of the supporting links 1, 2, 3, 4 determines the height of the tilting axes from the outer ring 8, the arrangement angle $\phi$ divides the setting angle α into a setting angle for the x tilting axis, which is the projection of the setting angle α onto the yz plane, and into a setting angle for the y tilting axis, which is the projection of the setting angle onto the zx plane.

If the supporting links 1, 2, 3, 4 are aligned radially with respect to the inner ring ($\phi=90°$), the projected angles α are of the same size, and consequently the x and y tilting axes lie equidistant from the outer ring 8. The x and y tilting axes intersect and then define a horizontal plane. In this case, there is also an equal lateral offset for both tilting direction.

The supporting links 1 to 4 may be arranged from tangentially ($\phi=0°$) to radially ($\phi=90°$) against the inner ring 7.

In the case of tangential arrangement of the supporting links 1 to 4, one tilting axis lies above the outer ring 8, while the other tilting axis lies at the same distance below the outer ring 8 (not represented).

This means that the two tilting axes, namely the x and y axes, in this way lie on different sides of the inner ring 7 or outer ring 8. The advantage of this design is that of a space-saving arrangement.

Depending on the requirements for the apparatus and the space conditions, if need be all the arrangement angles $\phi$ radial and tangential are possible.

In the choice of the arrangement angle $\phi$ of the supporting links 1, 2, 3, 4 it should be taken into account that non-intersecting tilting axes bring about different lateral offsets in the two tilting directions.

Figure 3:
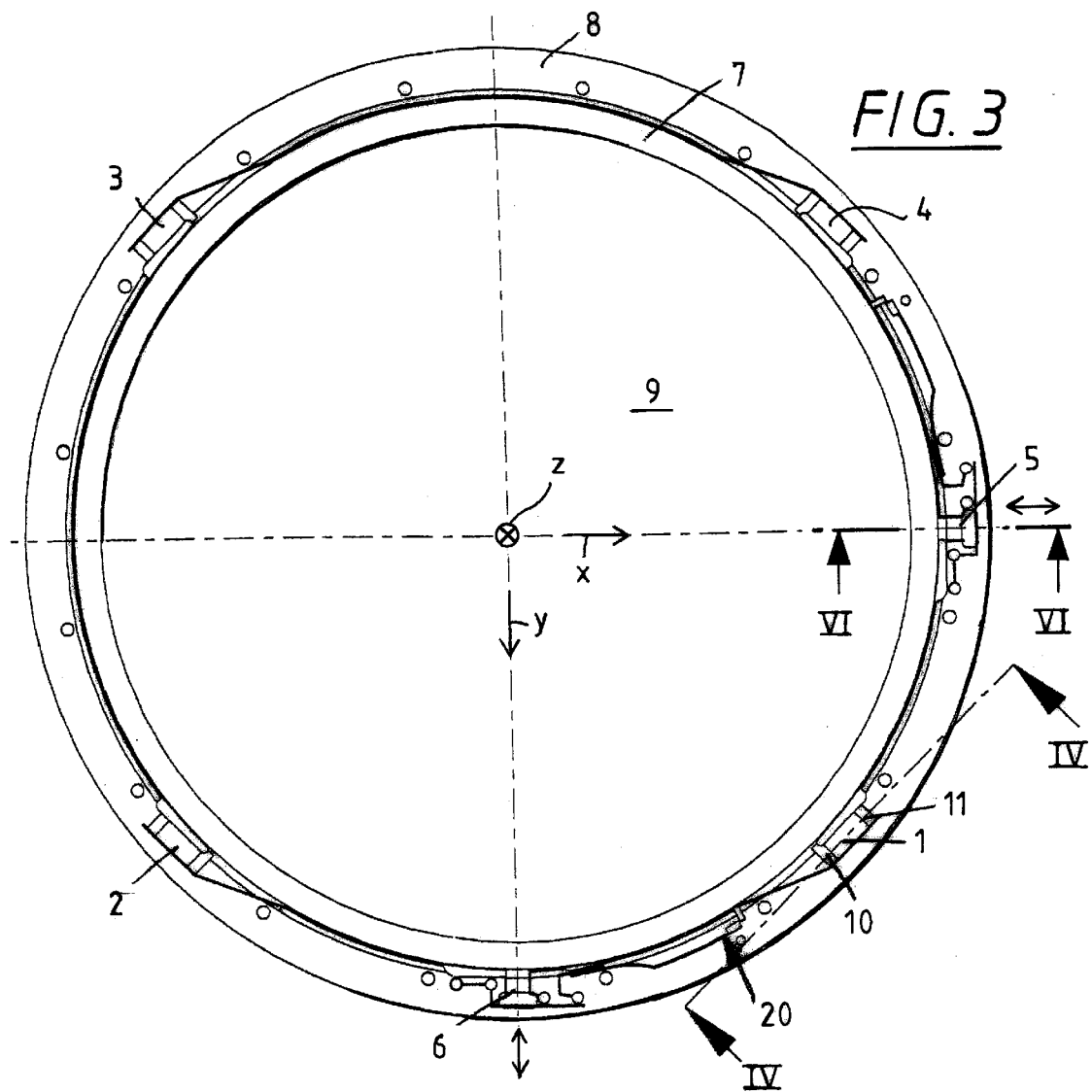
FIG. 3 shows a plan view of the apparatus according to the invention in one structural design.
Figure 4:
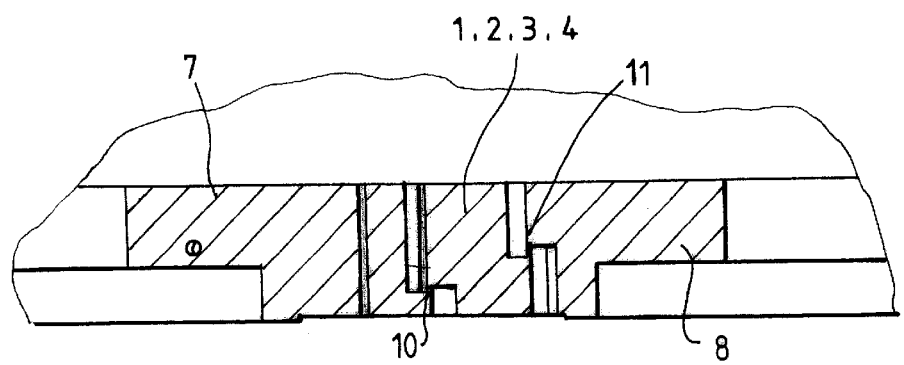
FIG. 4 shows a section along the line IV—IV of FIG. 3 in an enlarged representation.

In FIGS. 2 to 6, a possible design for the supporting links 1, 2, 3 and 4 and the adjusting links 5 and 6 is represented in plan view in a basic representation. As can be seen, the supporting links 1, 2, 3, 4 always lie on straight lines of 45° with respect to the inner ring. As can also be seen, the supporting links 1, 2, 3 and 4 are respectively connected via the joint 11 to the outer ring 8 and the joint 10 to the inner ring. FIG. 4 shows a section along the line IV—IV of FIG. 3 with a design of the supporting links 1 to 4 as solid joints in an enlarged representation. In this case, the points of articulation 10, 11 can also be seen.

The two adjusting links 5 and 6 may be adjusted either by acting on them directly or by means of adjusting screws 20 (see basic representation in FIG. 5), which act on the adjustment of the adjusting links 5 and 6 in the direction of the x and y axes (see arrows) by a parallel guide with a transmission ratio.

The parallel guide, represented only by way of example, has a transmission lever 21, on which the adjusting screw 20 acts. The transmission lever 21 is jointedly connected to an extension 22 of an angle lever 23, which in turn is connected by its other leg as the drive leg 24 to an adjusting plate 25 of the adjusting link 5 or 6. The adjusting angle 23 is connected via a jointed connection 26 to the outer ring 8. Via a further leg 27, the adjusting plate 25 is connected once again in a jointed manner to the outer ring 8. The adjusting angle 23, the adjusting plate 25 and the leg 27 form a parallel guide for the joint 11 of the adjusting link 5 or 6. As can be seen, adjusting movements of the adjusting screw 20 in the direction of the arrow lead to a displacement of the adjusting link 5 in the x direction and of the adjusting link 6 in the y direction. In this way, a very fine displacement or setting of the adjusting links 5 and 6 in the x and y directions respectively is obtained with the adjusting screw 20 provided with considerable adjustment travel.

Figure 6:
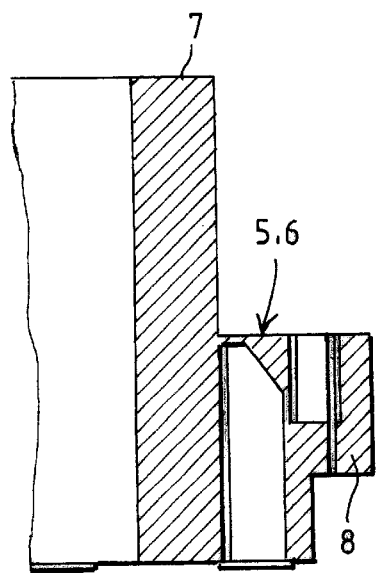
FIG. 6 shows a section along the line VI—VI of FIG. 3 in an enlarged representation.

FIG. 6 shows as an enlargement of a detail of section VI—VI of FIG. 3 a structural design of the adjusting link 5 or 6 with solid joints 10, 11.

Figure 7:
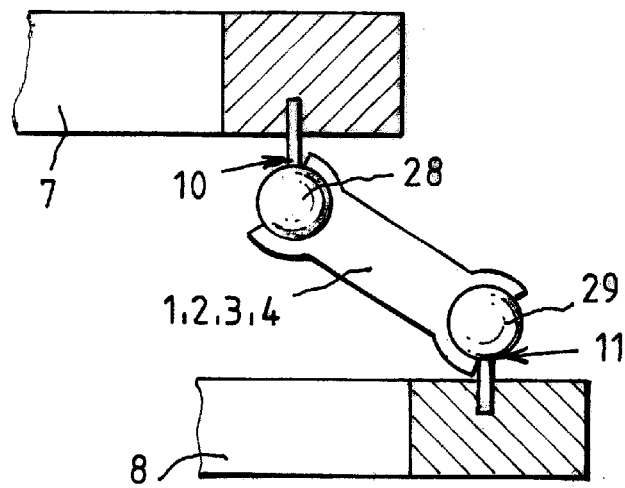
FIG. 7 shows an enlarged representation of a supporting link with ball joints.
Figure 8:
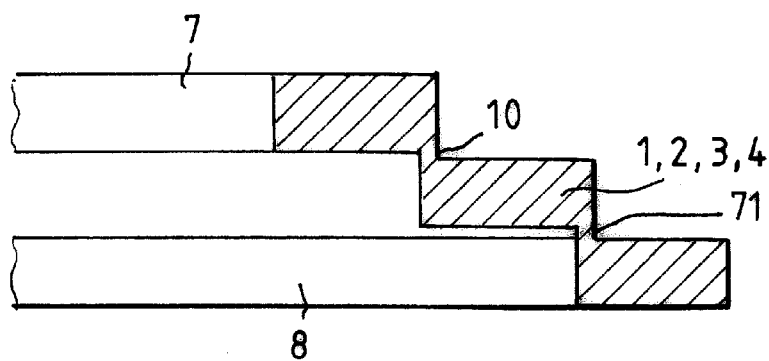
FIG. 8 shows an enlarged representation of a supporting link with solid joints.
Figure 9:
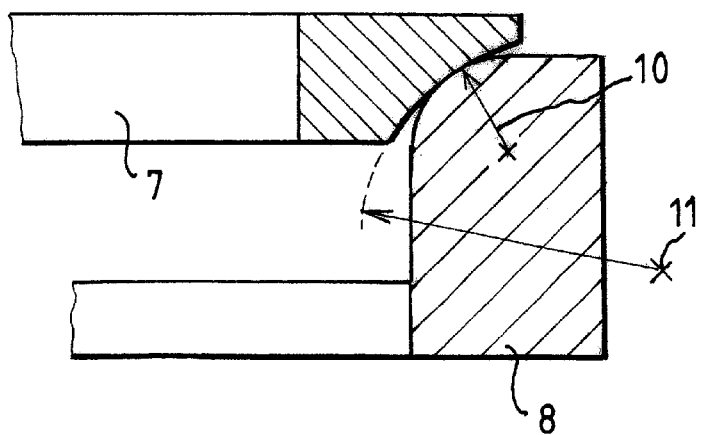
FIG. 9 shows an enlarged representation of a supporting link with spherical surfaces.

FIGS. 7 to 9 show a number of designs of supporting links, which are however only to be regarded a examples.

The supporting link 1, 2, 3, or 4 represented in FIG. 7 is provided with low-friction ball joints 28 and 29, which form the joints 10 and 11.

FIG. 8 shows an embodiment of the supporting links 1 to 4 with solid joints 10 and 11, as are represented in the exemplary embodiment according to FIGS. 1 to 6, to be precise by the formation of elastic, thin transitional points between the integrally fabricated inner ring 7 and outer ring 8.

FIG. 9 shows a special type, the supporting links 1 to 4 being formed by spherical surfaces between the inner ring 7 and the outer ring 8, or assuming their function. In this case, the joints 10 and 11 are formed by the surfaces of curvature on the inner ring 7 and on the outer ring 8, one radius of curvature being smaller than the other radius of curvature. The kinematic points of articulation 10 and 11 of this connection lie in this case on the center points of curvature of the spherical surfaces.

In the case of the exemplary embodiments described above, the apparatus has in each case four supporting links 1 to 4, the contact points of which on the inner ring 7 are distributed evenly around the circumference, and two adjusting links 5 and 6, which include an angle of 90°.

In the case of an embodiment of the supporting links 1 to 4 and the adjusting links 5 and 6 with solid joints, compensating links may be additionally fitted for a symmetrical deformation of the inner ring 7 by the bending moments of the solid joints. Such compensating links may be arranged circumferentially with respect to the adjusting links 5 and 6, but themselves have no adjusting function. It goes without saying that the compensating links may, however, also be arranged elsewhere. If the solid joints of such compensating links are replaced by ideal joints, the compensating links on the inner ring 7 must allow all six degrees of freedom.

Although only apparatuses with in each case four supporting links 1 to 4 are described above, it is expressly pointed out that other numbers, arrangements and designs of supporting links are also possible within the scope of the invention. For example, applicators are possible in which there are only two supporting links lying one opposite the other, which are arranged offset in each case by 90° with respect to adjusting links, which likewise lie opposite one another.

Instead of a lens 9, it goes without saying that a mirror or some other optical element that is isolated in terms of deformation may also be provided as the optical element.

What is claimed is:

1. An apparatus for tilting an object about at least one axis, in particular an optical element, such as a lens, comprising an outer ring, an inner ring and an object, said object being supported by said an inner ring and connected at at least three points to said outer ring, the tilting of the object about the axes lying perpendicular to the z axis being adjustable by at least two adjusting links, said object being supported by supporting links, said supporting links being distinct from said adjusting elements, said supporting links being connected to the outer ring the inner ring can rotate only about two mutually perpendicular tilting axes, said adjusting links directing movement about the mutually perpendicular tilting axes, and the tilting angles being adjustable by adjusting the adjusting links.

2. The apparatus as claimed in claim 1, wherein the supporting links are arranged in such a way that the tilting axes extend through the z axis.

3. The apparatus as claimed in claim 1, wherein the axes of the supporting links are inclined with respect to the z axis.

4. The apparatus as claimed in one of claims 1, wherein the supporting links are arranged in such a way that the tilting axes lies on different sides of the object.

5. The apparatus as claimed in claim 4, wherein the supporting links act tangentially on the inner ring.

6. The apparatus as claimed in one of claims 1, wherein the supporting links in each case have two joints, by means of which the connection between the inner ring and the outer ring or the mount is respectively established.

7. The apparatus as claimed in claim 6, wherein the joints are designed as solid joints.

8. The apparatus as claimed in claim 6, wherein the joints are designed as ball joints.

9. The apparatus as claimed in claim 6, wherein the joints are provided with spherical surfaces on the inner ring and on the outer ring.

10. The apparatus as claimed in one of claims 1, wherein the adjusting links are provided with setting elements, by which gearing-up transmission shifts of the adjustment travel are possible.

11. The apparatus as claimed in claim 10, wherein adjusting screws, which act on the adjusting links via transmission levers, are provided as setting elements.

12. The apparatus as claimed in claim 11, wherein the end of the adjusting links that is not connected to the inner ring is connected via a parallel guide to the outer ring and the transmission levers act on the parallel guide.

* * * * *

UNITED STATES PATENT AND TRADEMARK OFFICE
CERTIFICATE OF CORRECTION

PATENT NO.   : 6,271,976 B1   Page 1 of 1
DATED        : August 7, 2001
INVENTOR(S)  : Ulrich Weber It is certified that error appears in the above-identified patent and that said Letters Patent is hereby corrected as shown below:

Title page,
Item [73], Assignee, "Carl-Zeiss-Stiftung" should be
-- Carl-Zeiss-Stiftung trading as Carl Zeiss --

Column 6,
Lines 29-31, 34-37 and 45-48, please amend Claims 4, 6 and 10 to read as follows:

4. The apparatus as claimed in claim 1, wherein the supporting links are arranged in such a way that the tilting axes lies on different sides of the object.

6. The apparatus as claimed in claim 1, wherein the supporting links in each case have two joints, by means of which the connection between the inner ring and the outer ring or the mount is respectively established.

10. The apparatus as claimed in claim 1, wherein the adjusting links are provided with setting elements, by which gearing-up transmission shifts of the adjustment travel are possible.

Signed and Sealed this

Twentieth Day of May, 2003

JAMES E. ROGAN
*Director of the United States Patent and Trademark Office*